United States Patent
Kang et al.

(10) Patent No.: US 9,077,438 B2
(45) Date of Patent: Jul. 7, 2015

(54) NOISE DETECTION CIRCUIT, DELAY LOCKED LOOP AND DUTY CYCLE CORRECTOR INCLUDING THE SAME

(71) Applicant: SK hynix Inc., Gyeonggi-do (KR)

(72) Inventors: Tae-Wook Kang, Gyeonggi-do (KR); Kwang-Jin Na, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/077,933

(22) Filed: Nov. 12, 2013

(65) Prior Publication Data

US 2015/0043627 A1    Feb. 12, 2015

(30) Foreign Application Priority Data

Aug. 8, 2013    (KR) ........................ 10-2013-0094348

(51) Int. Cl.
     *H04B 3/46*      (2006.01)

(52) U.S. Cl.
     CPC ........................................ *H04B 3/46* (2013.01)

(58) Field of Classification Search
     USPC ........... 375/226, 371–376; 327/147, 153, 156
     See application file for complete search history.

(56) References Cited

U.S. PATENT DOCUMENTS

| | | | |
|---|---|---|---|
| 2004/0104750 A1 | 6/2004 | Bajaj et al. | |
| 2005/0017810 A1* | 1/2005 | Lin | 331/25 |
| 2005/0275479 A1* | 12/2005 | Sutton | 331/154 |
| 2007/0146028 A1* | 6/2007 | Lee | 327/161 |
| 2008/0061851 A1* | 3/2008 | Jeon | 327/158 |
| 2008/0297209 A1* | 12/2008 | Scuteri | 327/115 |
| 2012/0218001 A1* | 8/2012 | Leibowitz et al. | 327/9 |
| 2013/0154702 A1* | 6/2013 | Kim et al. | 327/158 |

FOREIGN PATENT DOCUMENTS

| | | |
|---|---|---|
| KR | 1020100049943 | 5/2010 |
| KR | 1020110060741 | 6/2011 |

\* cited by examiner

*Primary Examiner* — Khanh C Tran
(74) *Attorney, Agent, or Firm* — IP & T Group LLP

(57) ABSTRACT

A noise detection circuit includes a first delay unit suitable for delaying a periodic wave to output a delayed periodic wave, a first divider unit suitable for dividing the delayed periodic wave to output a first periodic wave, a second divider unit suitable for dividing the periodic wave to output a divided periodic wave, a second delay unit suitable for delaying the divided periodic wave to output a second periodic wave, and a detection unit suitable for comparing the first periodic wave with the second periodic wave and outputting a noise detection signal.

14 Claims, 3 Drawing Sheets

NOISE DETECTION CIRCUIT, DELAY LOCKED LOOP AND DUTY CYCLE CORRECTOR INCLUDING THE SAME

CROSS-REFERENCE TO RELATED APPLICATIONS

The present application claims priority of Korean Patent Application No. 10-2013-0094348, filed on Aug. 8, 2013, which is incorporated herein by reference in its entirety.

BACKGROUND

1. Field

Exemplary embodiments of the present invention relate to a technique for detecting noise occurring in an integrated circuit.

2. Description of the Related Art

Various integrated circuit chips operate based on a voltage applied from outside and internal voltages generated using the voltage applied from outside. However, when noise occurs in the voltages, the noise may cause various malfunctions of the integrated circuit chips.

In particular, since a large number of integrated circuit chips operate in synchronization with a clock, noise occurring in the integrated circuit chips may cause malfunctions of circuits such as a delayed locked loop (DLL) and a duty cycle corrector (DCC) that control a variation in delay value of a clock and the clock. Thus, the noise may have a fatal influence on operations of the integrated circuit chips.

SUMMARY

Various exemplary embodiments are directed to a technique for effectively detecting noise and a technique for stably controlling clock-based circuits based on the detected noise.

In an exemplary embodiment, a noise detection circuit may include: a first delay unit suitable for delaying a periodic wave to output a delayed periodic wave; a first divider unit suitable for dividing the delayed periodic wave to output a first periodic wave; a second divider unit suitable for dividing the periodic wave to output a divided periodic wave; a second delay unit suitable for delaying the divided periodic wave to output a second periodic wave; and a detection unit suitable for comparing the first periodic wave with the second periodic wave and outputting a noise detection signal.

In an exemplary embodiment, a delay locked loop (DLL) may include: a noise detection circuit suitable for detecting noise based on an output clock to output a noise detection signal; a phase detection circuit suitable for comparing a phase of a feedback clock with a phase of an input clock to output a phase comparison signal; a delay circuit suitable for generating the output clock by delaying the input clock by a delay value, and updating the delay value in response to the phase comparison signal while ignoring the phase comparison signal in response to the noise detection signal; and a replica delay unit suitable for generating the feedback clock by delaying the output clock.

In an exemplary embodiment, a duty cycle corrector (DCC) may include: a noise detection circuit suitable for detecting noise based on an output clock to output a noise detection signal; a duty detection circuit suitable for detecting a duty ratio of the output clock to output a duty detection signal; and a correction circuit suitable for correcting a duty ratio of the input clock based on a duty correction to amount, and updating the duty correction amount in response to the duty detection signal while ignoring the duty detection signal in response to the noise detection signal.

DETAILED DESCRIPTION

Figure 1:
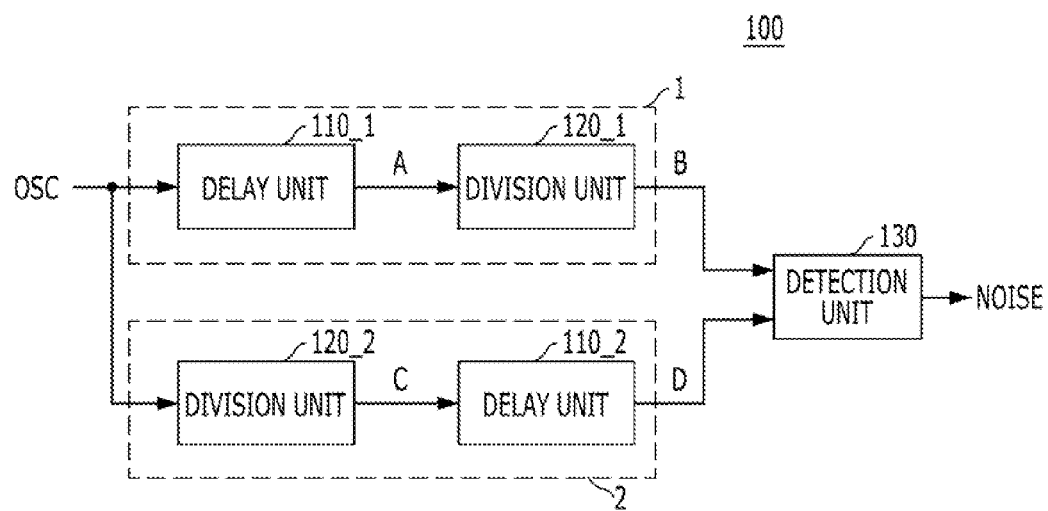
FIG. 1 is a block diagram illustrating a noise detection circuit in accordance with an exemplary embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that, in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a noise detection circuit in accordance with an exemplary embodiment of the present invention.

Referring to FIG. 1, the noise detection circuit 100 includes first and second delay units 110_1 and 110_2, first and second divider units 120_1 and 120_2, and a detection unit 130. The noise detection circuit 100 receives a periodic wave OSC used in an integrated circuit chip to detect noise of the integrated circuit chip. The periodic wave OSC may include a clock or any signals which periodically toggle.

The noise detection circuit 100 includes first and second paths 1 and 2. The first delay unit 110_1 and the first divider unit 120_1 coupled in series are provided in the first path 1. The first delay unit 110_1 delays the periodic wave OSC by a given time to output a delayed periodic wave A, and the first divider unit 120_1 divides the delayed periodic wave A to output a first periodic wave B. For example, the first periodic wave B outputted through the first path 1 may have a frequency corresponding to a half of a frequency of the delayed periodic wave A.

The second divider unit 120_2 and the second delay unit 110_2 coupled in series are provided in the second path 2. The second divider unit 120_2 divides the periodic wave OSC to output a divided periodic wave C, and the second delay unit 110_2 delays the divided periodic wave C by a predetermined time to output a second periodic wave D. The second divider unit 120_2 and the first divider unit 120_1 are designed in substantially the same manner, and the second delay unit 110_2 and the first delay unit 110_1 are designed in substantially the same manner. That is, the first divider unit 120_1 and the second divider unit 120_2 are composed of the same components to have the same division ratio. Similarly, the first delay unit 110_1 and the second delay unit 110_2 are composed of the same components to have the same delay value.

The detection unit 130 compares the first periodic wave B outputted through the first path 1 with the second periodic wave D outputted through the second path 2 and generates a detection signal NOISE indicating whether noise occurred or not. The first and second delay units 110_1 and 110_2, which are composed of the same components, and the first and second divider units 120_1 and 120_2, which are composed of the same components, are provided in the first path 1 and the second path 2, respectively, but arrangement sequences of components provided in the first path 1 and the second path 2 may be different from each other. Thus, in a normal case, the first periodic wave B and the second periodic wave D must be equal to each other. However, when the noise occurs, the first periodic wave B and the second periodic wave D may differ from each other, and the detection unit 130 detects the difference and generates the detection signal NOISE. That is, when the first periodic wave B and the second periodic wave D are equal to each other, the detection unit 130 determines that there is no noise, and when the first periodic wave B and the second periodic wave D are different from each other, the detection unit 130 determines that noise exists. The reason that the first periodic wave B and the second periodic wave D differ from each other when the noise occurs will be described with reference to FIG. 2.

Figure 2:
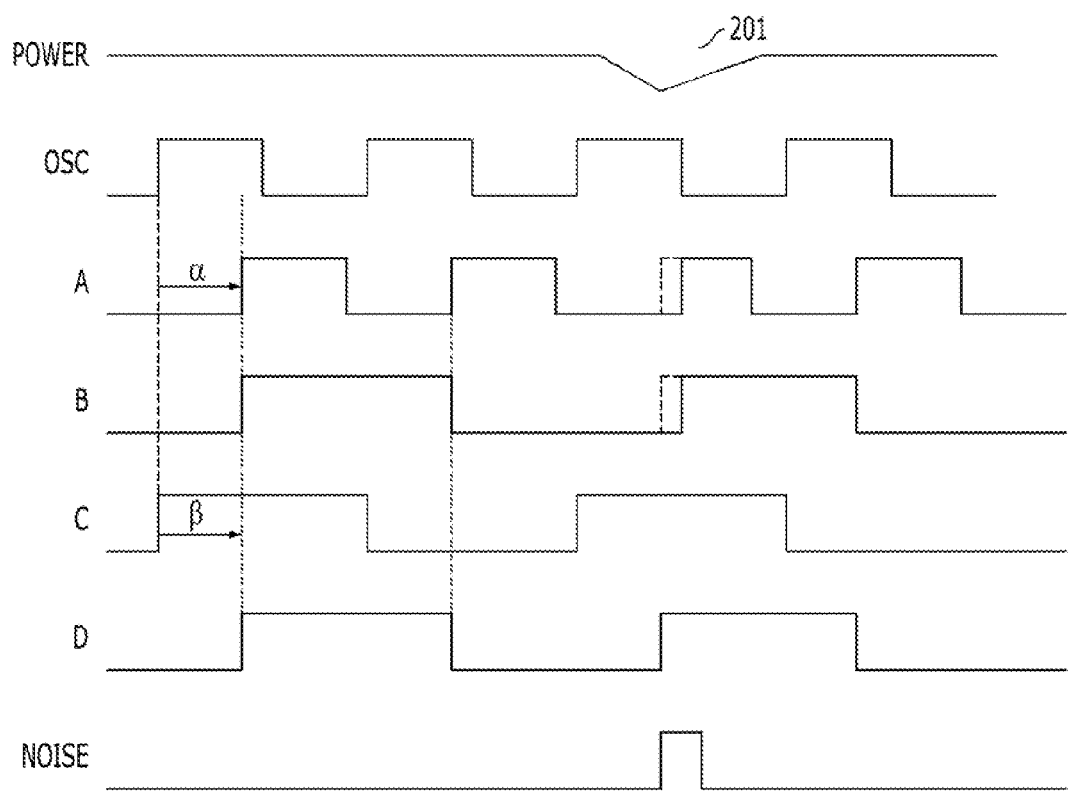
FIG. 2 is a waveform diagram illustrating periodic waves of FIG. 1.

FIG. 2 is a waveform diagram illustrating the periodic waves OSC, A, B, C and D of FIG. 1.

Referring to FIG. 2, the first delay unit 110_1 delays the periodic wave OSC by the given time α and generates the delayed periodic wave A. Furthermore, the first divider unit 120_1 generates the first periodic wave B having a high pulse width or low pulse width corresponding to a period between adjacent rising edges of the delayed periodic wave A.

The second divider unit 120_2 generates the divided periodic wave C having a high pulse width or low pulse width corresponding to a period between adjacent rising edges of the periodic wave OSC. Furthermore, the second delay unit 110_2 delays the divided periodic wave C by the predetermined time β and generates the second periodic wave D.

During a period in which power is constant, that is, during a period in which power has no noise, the first periodic wave B outputted through the first path 1 and the second periodic wave D outputted through the second path 2 are equal to each other. Thus, the detection signal NOISE of the detection unit 130 is deactivated during the period in which power is constant.

During a period 201 in which power is unstable, that is, during a period in which power has noise, a rising edge of the delayed periodic wave A is shifted backward by the unstable power. Thus, a rising edge of the first periodic wave B divided based on the rising edge of the periodic wave A is also shifted backward in response to the delayed period wave A. In the second path 2, the divided periodic wave C is almost uninfluenced by the noise because the divided periodic wave C is already divided by the second divider unit 120_2 and has a frequency lower than the delayed periodic wave A. Furthermore, since edges of the divided periodic wave C are not included in the period 201 in which the power is unstable, the divided periodic wave C is almost uninfluenced by the noise even while the divided periodic wave C is delayed by the second delay unit 110_2.

That is, in the first path 1, since the periodic wave OSC is delayed and divided to be processed into the first periodic wave B, the first periodic wave B is significantly influenced by the noise. In the second path 2, however, since the periodic wave OSC is divided and delayed to be processed into the second periodic wave D, the second periodic wave D is almost uninfluenced by the noise. Thus, during the period 210 in which the noise exists, the first periodic wave B and the second periodic wave D differ from each other. The detection unit 130 detects the difference to activate the detection signal NOISE in response to the detected difference.

Figure 3:
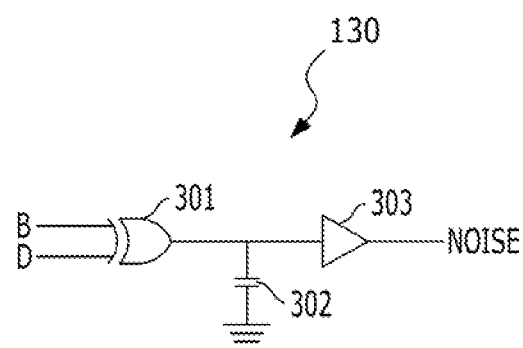
FIG. 3 is a circuit diagram illustrating a detection unit of FIG. 1.

FIG. 3 is a circuit diagram illustrating the detection unit 130 of FIG. 1.

Referring to FIG. 3, the detection unit 130 includes an XOR gate 301, a capacitor 302, and a driver 303. The XOR gate 301 receives the first periodic wave B outputted through the first path 1 and the second periodic wave D outputted through the second path 2, and the capacitor 302 is coupled between an output terminal of the XOR gate 301 and a ground voltage terminal. When the first periodic wave B and the second periodic wave D are equal to each other, the XOR gate 301 outputs an output signal at a low level, and when the first periodic wave B and the second periodic wave D are different from each other, the XOR gate 301 outputs the output signal at a high level. The capacitor 302 is used to remove a high frequency component existing in the output signal of the XOR gate 301, that is, noise. As the capacitor 302 has a large capacitance, the sensitivity of the detection unit 130 increases, and as the capacitor 302 has a small capacitance, the sensitivity of the detection unit 130 decreases. The driver 303 drives the output signal of the XOR gate 301 to the detection signal NOISE.

As described, the detection unit 130 outputs the detection signal NOISE at a low level when the first periodic wave B is equal to the second periodic wave D, and outputs the detection signal NOISE at a high level when the first periodic wave B is different from the second periodic wave D.

Figure 4:
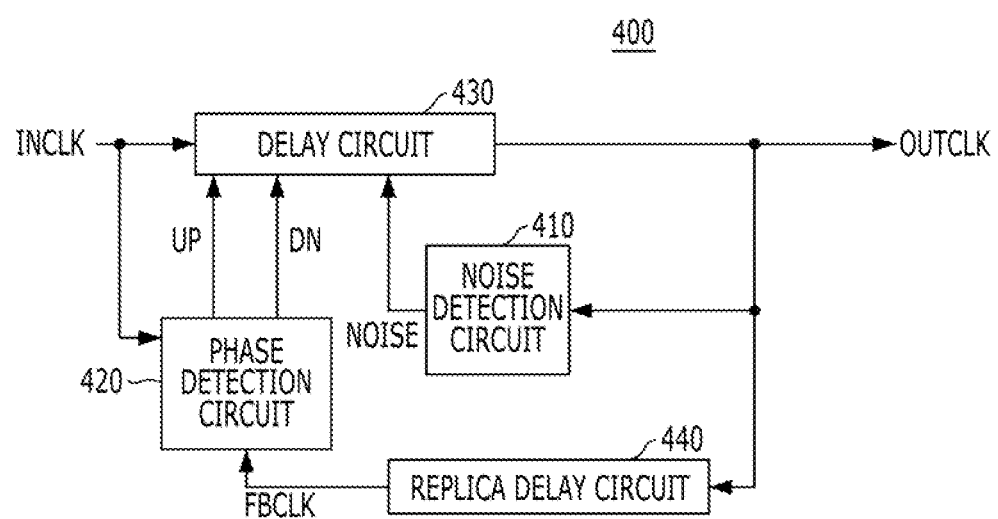
FIG. 4 is a block diagram illustrating a delay locked loop (DLL) in accordance with an exemplary embodiment of the present invention.

FIG. 4 is a block diagram illustrating a delay locked loop (DLL) in accordance with an exemplary embodiment of the present invention. In FIG. 4, the noise detection circuit 100 described with reference to FIGS. 1 to 3 is applied to the DLL.

Referring to FIG. 4, the DLL 400 includes a noise detection circuit 410, a phase detection circuit 420, a delay circuit 430, and a replica delay circuit 440.

The noise detection circuit 410 detects noise based on an output clock OUTCLK of the DLL 400, and outputs a detection signal NOISE. The noise detection circuit 410 may include the noise detection circuit 100 illustrated in FIG. 1.

The replica delay circuit 440 delays the output clock OUTCLK of the DLL 400 and generates a feedback clock FBCLK. The replica delay circuit 440 has a delay amount obtained by modeling delay elements through which a clock is to pass within a system to which the DLL 400 is applied.

The phase detection circuit 420 compares a phase of an input clock INCLK of the DLL 400 with a phase the feedback clock FBCLK and generates an up signal UP or a down signal DN. The input clock INCLK is inputted from the outside of the system. When the phase of the input clock INCLK leads the phase of the feedback clock FBCLK, the phase detection circuit 420 activates and outputs the down signal DN, and when the phase of the feedback clock FBCLK leads the phase of the input clock INCLK, the phase detection circuit 420 activates and outputs the up signal UP.

The delay circuit 430 delays the input clock INCLK by a delay amount, and generates the output clock OUTCLK. The delay amount of the delay circuit 430 is updated in response to the up signal UP and the down signal DN. When the up signal UP is activated, the delay amount of the delay circuit 430 increases, and when the down signal DN is activated, the delay amount of the delay circuit 430 decreases. The delay circuit 430 receives the detection signal NOISE of the noise detection circuit 410. When noise is detected by the noise detection circuit 410, the delay circuit 430 ignores the up signal UP and the down signal DN. That is, when the detection signal NOISE is activated to a high level, the delay amount of the delay circuit 430 does not vary regardless of logic levels of the up signal UP and the down signal DN. The reason why the delay circuit 320 ignores the up signal UP and the down signal DN when the noise is detected is that the up signal UP or the down signal DN of the phase detection circuit 420 may not be trusted when the noise occurred.

In the DLL 400 in accordance with the exemplary embodiment of FIG. 4, when the noise is detected, the delay amount of the DLL 400 is not updated. Thus, a malfunction of the DLL 400 may be prevented from occurring due to the noise.

Figure 5:
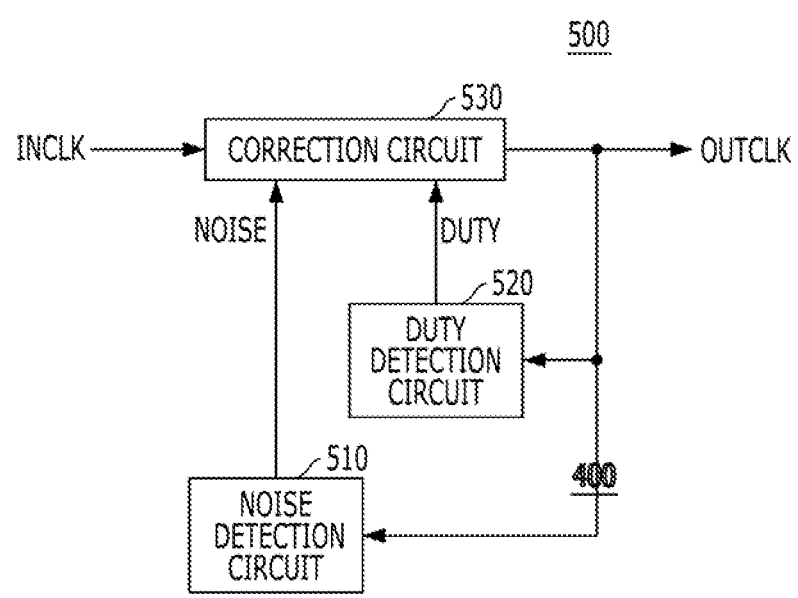
FIG. 5 is a block diagram illustrating a duty cycle corrector (DCC) in accordance with an exemplary embodiment of the present invention.

FIG. 5 is a block diagram illustrating a duty cycle corrector (DCC) in accordance with an exemplary embodiment of the present invention. In FIG. 5, the noise detection circuit described with reference to FIGS. 1 to 3 may be applied to the DCC.

Referring to FIG. 5, the DCC 500 includes a noise detection circuit 510, a duty detection circuit 520, and a correction circuit 530.

The noise detection circuit 510 detects noise based on an output clock OUTCLK of the DCC 500. The noise detection circuit 510 may include the noise detection circuit 100 illustrated in FIG. 1.

The duty detection circuit 520 compares the magnitudes of a high pulse period with a low pulse period of the output clock OUTCLK and outputs a duty ratio detection result DUTY. The duty ratio detection result DUTY indicates which one of the high pulse period and the low pulse period of the output clock OUTCLK is longer than the other.

The correction circuit 530 corrects a duty ratio of an input clock INCLK based on a duty correction amount, and generates the output clock OUTCLK. The duty correction amount of the correction circuit 530 is updated based on the duty ratio detection result DUTY. When the duty ratio detection result DUTY indicates that the high pulse period of the output clock OUTCLK is longer than the low pulse to period, the duty correction amount may be updated to lengthen the low pulse period of the output clock OUTCLK. Furthermore, when the duty ratio detection result DUTY indicates that the low pulse period of the output clock OUTCLK is longer than the high pulse period, the duty correction amount may be updated to lengthen the high pulse period of the output clock OUTCLK. The method for correcting the duty ratio of the input clock INCLK by the correction circuit 530 may be implemented in various manners. For example, a voltage level of the input clock INCLK may be increased or decreased, or a relative delay value of the input clock INCLK may be adjusted. The correction circuit 530 receives the detection signal NOISE of the noise detection circuit 510. When the noise is detected by the noise detection circuit 510, the correction circuit 530 ignores the duty ratio detection result DUTY. That is, when the detection signal NOISE is activated to a high level, the duty correction amount of the correction circuit 530 does not vary regardless of the duty ratio detection result DUTY. This is because the duty detection result DUTY of the duty detection circuit 520 may not be trusted when the noise occurs.

In the DCC 500 in accordance with the exemplary embodiment of FIG. 5, when the noise is detected, the duty correction amount of the DCC 500 is not updated. Thus, a malfunction of the DCC 500 may be prevented from occurring due to the noise.

In accordance with the exemplary embodiments of the present invention, it is possible to effectively detect noise and stably control clock-based circuits using the detected noise.

Although various embodiments have been described for illustrative purposes, it will be apparent to those skilled in the art that various changes and modifications may be made without departing from the spirit and scope of the invention as defined in the following claims.

In the above-described embodiments, the noise detection circuit is applied to the DLL and the DCC. However, the present invention is not limited thereto, and the noise detection circuit may be applied to various circuits sensitive to noise.

What is claimed is:

1. A noise detection circuit comprising:
    a first delay unit suitable for delaying a periodic wave to output a delayed periodic wave;
    a first divider unit suitable for dividing the delayed periodic wave to output a first periodic wave;
    a second divider unit suitable for dividing the periodic wave to output a divided periodic wave;
    a second delay unit suitable for delaying the divided periodic wave to output a second periodic wave; and
    a detection unit suitable for comparing the first periodic wave with the second periodic wave and outputting a noise detection signal.

2. The noise detection circuit of claim 1, wherein the first delay unit has substantially the same configuration as the second delay unit, and the first divider unit has substantially the same configuration as the second divider unit.

3. The noise detection circuit of claim 1, wherein, when the first periodic wave is equal to the second periodic wave, the detection unit outputs the noise detection signal indicating that no noise exists, and
    when the first periodic wave is different from the second periodic wave, the detection unit outputs the noise detection signal indicating that noise exists.

4. The noise detection circuit of claim 1, wherein the detection unit comprises:
    a logic gate suitable for performing an XOR operation on the first periodic wave and the second periodic wave; and
    a capacitor coupled to an output terminal of the logic gate.

5. A delay locked loop (DLL) comprising:
    a noise detection circuit suitable for detecting noise based on an output clock to output a noise detection signal which is activated when noise is detected;
    a phase detection circuit suitable for comparing a phase of a feedback clock with a phase of an input clock to output a phase comparison signal;
    a delay circuit suitable for generating the output clock by delaying the input clock by a delay value, and updating the delay value in response to the phase comparison signal while ignoring the phase comparison signal in response to activation of the noise detection signal; and
    a replica delay unit suitable for generating the feedback clock by delaying the output clock.

6. The DLL of claim 5, wherein the delay circuit ignores the phase comparison signal when the noise detection signal indicates that the noise exists.

7. The DLL of claim 5, wherein the noise detection circuit comprises:
    a first delay unit suitable for delaying the output clock;
    a first divider unit suitable for dividing a clock delayed by the first delay unit;
    a second divider unit suitable for dividing the output clock;
    a second delay unit suitable for delaying a clock divided by the second divider unit; and a detection unit suitable for comparing the clock divided by the first divider unit with the clock delayed by the second delay unit, and outputting the noise detection signal.

8. The DLL of claim 7, wherein the first delay unit has substantially the same configuration as the second delay unit, and the first divider unit has substantially the same configuration as the second divider unit.

9. The DLL of claim 7, wherein, when the clock divided by the first divider unit is equal to the clock delayed by the second delay unit, the detection unit outputs the noise detection signal indicating that no noise exists, and when the clock divided by the first divider unit is different from the clock delayed by the second delay unit, the detection unit outputs the noise detection signal indicating that the noise exists.

10. A duty cycle corrector (DCC) comprising:
a noise detection circuit suitable for detecting noise based on an output clock to output a noise detection signal which is activated when noise is detected;
a duty detection circuit suitable for detecting a duty ratio of the output clock to output a duty detection signal; and
a correction circuit suitable for correcting a duty ratio of the input clock based on a duty correction amount, and updating the duty correction amount in response to the duty detection signal while ignoring the duty detection signal in response to activation of the noise detection signal.

11. The DCC of claim 10, wherein the correction circuit ignores the duty detection signal when the noise detection signal indicates that the noise exists.

12. The DCC of claim 10, wherein the noise detection circuit comprises:
a first delay unit suitable for delaying the output clock;
a first divider unit suitable for dividing a clock delayed by the first delay unit;
a second divider unit suitable for dividing the output clock;
a second delay unit suitable for delaying a clock divided by the second divider unit; and
a detection unit suitable for comparing a clock divided by the first divider unit with a clock delayed by the second delay unit and outputting the noise detection signal.

13. The DCC of claim 12, wherein the first delay unit has substantially the same configuration as the second delay unit, and the first divider unit has substantially the same configuration as the second divider unit.

14. The DCC of claim 10, wherein, when the clock divided by the first divider unit is equal to the clock delayed by the second delay unit, the detection unit outputs the noise detection signal indicating that no noise exists, and
when the clock divided by the first divider unit is different from the clock delayed by the second delay unit, the detection unit outputs the noise detection signal indicating that the noise exists.

* * * * *